United States Patent
Pinai

(10) Patent No.: US 7,212,042 B1
(45) Date of Patent: May 1, 2007

(54) BELOW-GROUND SENSOR INTERFACE AMPLIFIER

(75) Inventor: Hoang Minh Pinai, Saratoga, CA (US)

(73) Assignee: ZiLOG, Inc., San Jose, CA (US)

( * ) Notice: Subject to any disclaimer, the term of this patent is extended or adjusted under 35 U.S.C. 154(b) by 68 days.

(21) Appl. No.: 10/928,492

(22) Filed: Aug. 27, 2004

(51) Int. Cl.
  *H03K 5/22* (2006.01)
(52) U.S. Cl. .............................. 327/63; 327/65; 327/72
(58) Field of Classification Search .................. 327/63, 327/65
  See application file for complete search history.

(56) References Cited

U.S. PATENT DOCUMENTS

| | | | |
|---|---|---|---|
| 4,232,271 A | 11/1980 | Dobkin et al. | 330/258 |
| 5,276,405 A | 1/1994 | Mazzucco et al. | 330/257 |
| 5,528,193 A | 6/1996 | Maida | 327/534 |
| 5,541,484 A * | 7/1996 | DiTucci | 318/254 |
| 5,627,494 A * | 5/1997 | Somerville | 330/257 |
| 5,841,310 A | 11/1998 | Kalthoff et al. | 327/337 |
| 6,169,428 B1 | 1/2001 | Mader | 327/101 |
| 6,232,821 B1 | 5/2001 | King et al. | 327/390 |
| 6,291,950 B1 * | 9/2001 | Jeong | 318/254 |
| 6,586,896 B2 * | 7/2003 | Menegoli | 318/254 |
| 2004/0027083 A1 * | 2/2004 | Suzuki | 318/434 |
| 2004/0166803 A1 * | 8/2004 | Moloudi et al. | 455/20 |
| 2005/0140347 A1 * | 6/2005 | Chen et al. | 323/282 |

FOREIGN PATENT DOCUMENTS

JP  04317580 A  * 11/1992

* cited by examiner

*Primary Examiner*—Quan Tra
(74) *Attorney, Agent, or Firm*—Imperium Patent Works; Darien K. Wallace

(57) ABSTRACT

A below-ground sensor interface amplifier is powered by no negative supply voltage, but the amplifier nevertheless senses an input voltage signal below ground potential. The amplifier outputs an output voltage signal that varies proportionately to the input voltage. For an input voltage beginning below ground potential and increasing past ground potential, the amplifier outputs an output voltage that remains between ground potential and a supply voltage. The output voltage increases proportionately to the increase of the input voltage. As the input voltage increases, a gate voltage on a first transistor begins to increase starting at the input voltage at which a second transistor is forced to turn on. The amplifier senses input voltages more than one threshold voltage below ground potential without using a below-ground supply voltage. The gain of the amplifier, as well as the lower limit and the size of the amplifier's voltage operating range are programmable.

13 Claims, 8 Drawing Sheets

SENSING A VOLTAGE BELOW GROUND

BELOW-GROUND SENSOR INTERFACE AMPLIFIER

TECHNICAL FIELD

The present invention relates generally to integrated circuit amplifiers and, more specifically, to a sensor interface amplifier that can sense an input voltage below ground.

BACKGROUND

An integrated circuit microcontroller can be used to generate the signals that power electric motors, such as alternating current (AC) induction motors. The drive signals are typically generated from a direct current (DC) power supply that is switched and alternately inverted. One switching technique used to generate the drive signals is called space-vector pulse width modulation (PWM). For example, in an electric motor with three induction coils each separated by 120 degrees, space-vector PWM governs the times and the durations at which six switches are opened and closed to produce the six pulsed signals for the inverter stage of the motor drive. Space-vector PWM is used not only to generate the drive currents, but also to control the electric motor. Space-vector control defines the PWM time intervals for each of the six sectors of the electric motor to control the rotation of the electric motor.

In order to perform space-vector control, however, the microcontroller should accurately determine the currents and voltages emitted from the inductive coils of the electric motor. As the drive currents into the coils increase and decrease, expanding and collapsing magnetic fields are created that in turn generate currents in addition to the drive currents. The sum of these currents can result in a voltage drop across a voltage sensor that falls below the ground potential of the DC power supply. Therefore, a voltage below ground potential should be measured in order accurately to determine the currents and voltages emitted from the inductive coils.

Various circuits have been used to sense voltage for space-vector control of AC induction motors. Some voltage sensing circuits require a negative voltage supply. But it is expensive to add to the circuit a second power supply that is below ground potential. Other voltage sensing circuits employ two differential pair of transistors. These sensing circuits typically sense negative voltages only down to one threshold voltage below ground potential. Moreover, sensor interface amplifiers employing two differential pair of transistors typically do not generate a linear amplification of input voltages at the low end of their response ranges.

A sensing circuit is sought that senses voltages more than one threshold voltage below ground potential and that does not use a below-ground power supply.

SUMMARY

An integrated circuit includes an amplifier that receives an input voltage signal and generates an output voltage signal. The amplifier has an input voltage operating range that extends below minus one volts. The integrated circuit has a ground terminal for receiving a ground potential, a power supply terminal for receiving a supply voltage, but no terminal for receiving a negative supply voltage. The supply voltage lies above the ground potential, and the integrated circuit includes no negative voltage supply. The output voltage signal varies substantially proportionately to the input voltage signal, and the output voltage signal remains between the ground potential and the supply voltage.

In accordance with a method, an output voltage is generated that remains between a ground potential and a supply voltage and that varies proportionately to a change in an input voltage, where the input voltage can be below the ground potential. A below-ground sensor interface (BGSI) amplifier receives the input voltage signal and outputs an output voltage signal. For an input voltage beginning below the ground potential and increasing past the ground potential, the BGSI amplifier outputs an output voltage that remains between the ground potential and a supply voltage. The output voltage increases proportionately to the increase in the input voltage. As the input voltage increases, a gate voltage on a gate lead of a first transistor begins to increase starting at the particular input voltage at which a second transistor is forced to turn on. The amplifier senses input voltages more than one threshold voltage below the ground potential without using a below-ground supply voltage.

An apparatus is disclosed wherein an amplifier includes a first transistor that is smaller than a second transistor. An input lead of the amplifier is coupled to a source lead of the first transistor. A drain lead of the first transistor is coupled to a gate lead of the second transistor. When an input voltage on the input lead is below a ground potential and is increasing, the amplifier outputs an output voltage that remains between the ground potential and a positive supply voltage and that increases proportionately to the increase in the input voltage. A drain voltage on the drain lead of the first transistor increases in response to the increase in the input voltage. The second transistor turns on in response to the increase in the drain voltage of the first transistor. The output voltage increases proportionately to the increase in the input voltage only for input voltages greater than the particular input voltage at which a second transistor is forced to turn on.

A programmable system controls an electric motor by determining the magnitude of a current flowing from an induction coil of the electric motor. The system determines the magnitude of the current by sensing an input voltage that lies below a ground potential and generating an output voltage that remains between a ground potential and a supply voltage. A gain control register is used to program the gain of output voltage, as well as the lower limit and the size of the operating range of the input voltage. The system is programmed when a processor writes to the gain control register. The system is not powered by any supply voltage that lies below the ground potential.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
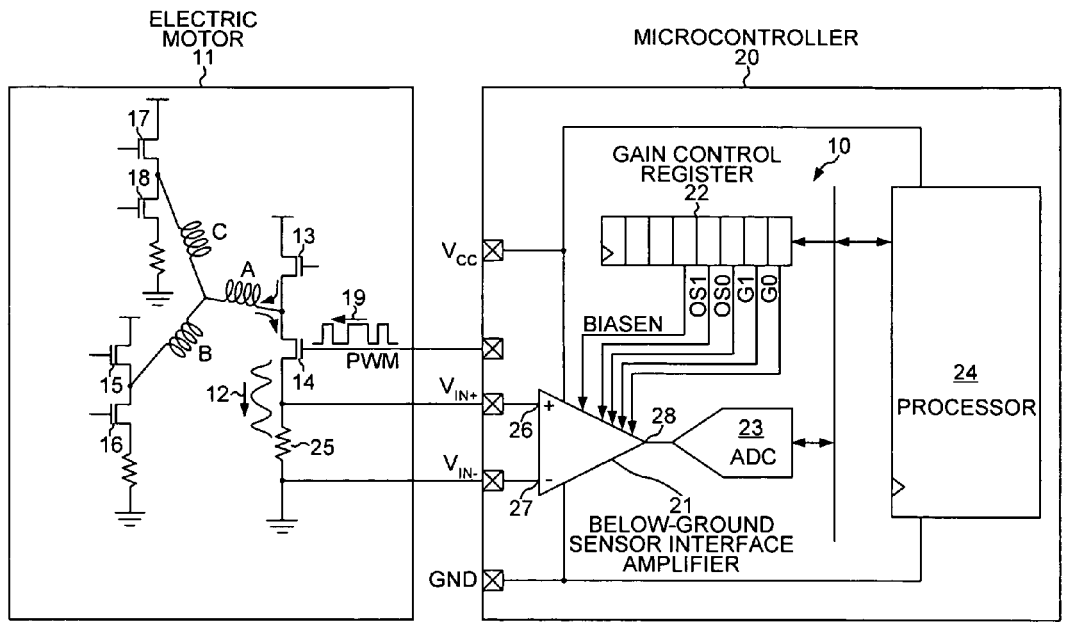
FIG. 1 is a simplified schematic block diagram of a system for sensing an input voltage that lies below a ground potential, including a below-ground sensor interface amplifier.

FIG. 1 shows a system 10 for sensing an input voltage that lies below a ground potential. System 10 is used to control an electric motor 11 by determining the magnitude of a current 12 flowing from one of three induction coils (A, B and C) of electric motor 11. The three coils are separated from one another by 120 degrees. Six field effect transistor switches 13–18 are opened and closed to produce the drive currents that power electric motor 11. For example, a switching signal 19 is generated using space-vector pulse width modulation (PWM) and controls the times and durations during which switch 14 is conductive.

System 10 is incorporated into a microcontroller 20 that is specially adapted for motor control applications. For example, microcontroller 20 is a Z8 Encore! Flash Motor Control microcontroller manufactured by ZiLOG, Inc. of San Jose, Calif. System 10 includes a below-ground sensor interface amplifier 21, a gain control register 22, an analog-to-digital converter (ADC) 23 and a processor 24. System 10 determines the magnitude of current 12 of electric motor 11 by determining the voltage drop across a resistance 25 in the path of current 12. In one embodiment, a non-inverting input lead 26 of below-ground sensor interface (BGSI) amplifier 21 is connected above resistance 25, and an inverting input lead 27 is connected below resistance 25. In another embodiment, inverting input lead 27 is coupled directly to a ground potential. System 10 determines the voltage drop by comparing an input voltage $V_{IN+}$ on a non-inverting input lead 26 to the voltage $V_{IN-}$ on inverting input lead 27.

BGSI amplifier 21 is powered by a positive supply voltage ($V_{CC}$) that lies above a ground potential (GND). In this example, the supply voltage is +3 volts. Although microcontroller 20 is formed on an integrated circuit that may include one or more back bias generators, system 10 is not powered by any power supply below ground potential. BGSI amplifier 21 receives input voltage $V_{IN+}$ onto non-inverting input lead 26 and outputs an output voltage with a programmable gain and offset onto an output lead 28. For example, where input voltage $V_{IN+}$ varies between a negative voltage and ground potential, the output voltage can be programmed to vary between ground potential and the supply voltage. In one programmed state of system 10, input voltage $V_{IN+}$ increases from a negative voltage to ground potential, and BGSI amplifier 21 outputs an output voltage between ground potential and the supply voltage that increases proportionately to the increase of input voltage $V_{IN+}$.

Figure 2:
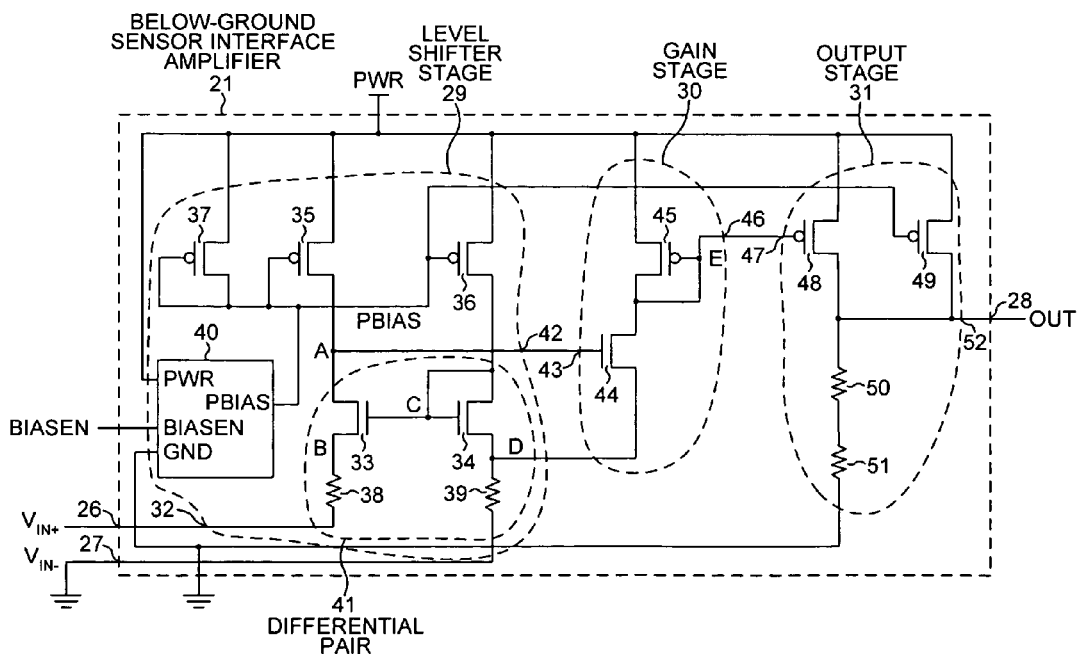
FIG. 2 is a more detailed diagram of the below-ground sensor interface amplifier of FIG. 1.

FIG. 2 shows BGSI amplifier 21 in more detail. BGSI amplifier 21 includes a level shifter stage 29, a gain stage 30 and an output stage 31. Non-inverting input lead 26 of BGSI amplifier 21 is coupled to an input lead 32 of level shifter stage 29. Level shifter stage 29 includes five transistors 33–37, two resistors 38–39 and a bias generating circuit 40. Transistor 33 and transistor 34 are n-channel field effect transistors (FETs) that together form a differential pair 41. When a bias enable signal (BIASEN) is asserted, bias generating circuit 40 outputs a bias signal (PBIAS) that biases the gates of transistors 35, 36, 37, 45, 48 and 49 such that the transistors are turned on. Transistors 35, 36, 37, 45, 48 and 49 are p-channel FETs. An output lead 42 of level shifter stage 29 is coupled to an input lead 43 of gain stage 30. Gain stage 30 includes two transistors 44–45. An output lead 46 of gain stage 30 is coupled to an input lead 47 of output stage 31. Output stage 31 includes two transistors 48–49 and two resistors 50–51. An output lead 52 of output stage 31 is coupled to output lead 28 of BGSI amplifier 21.

Figure 3:
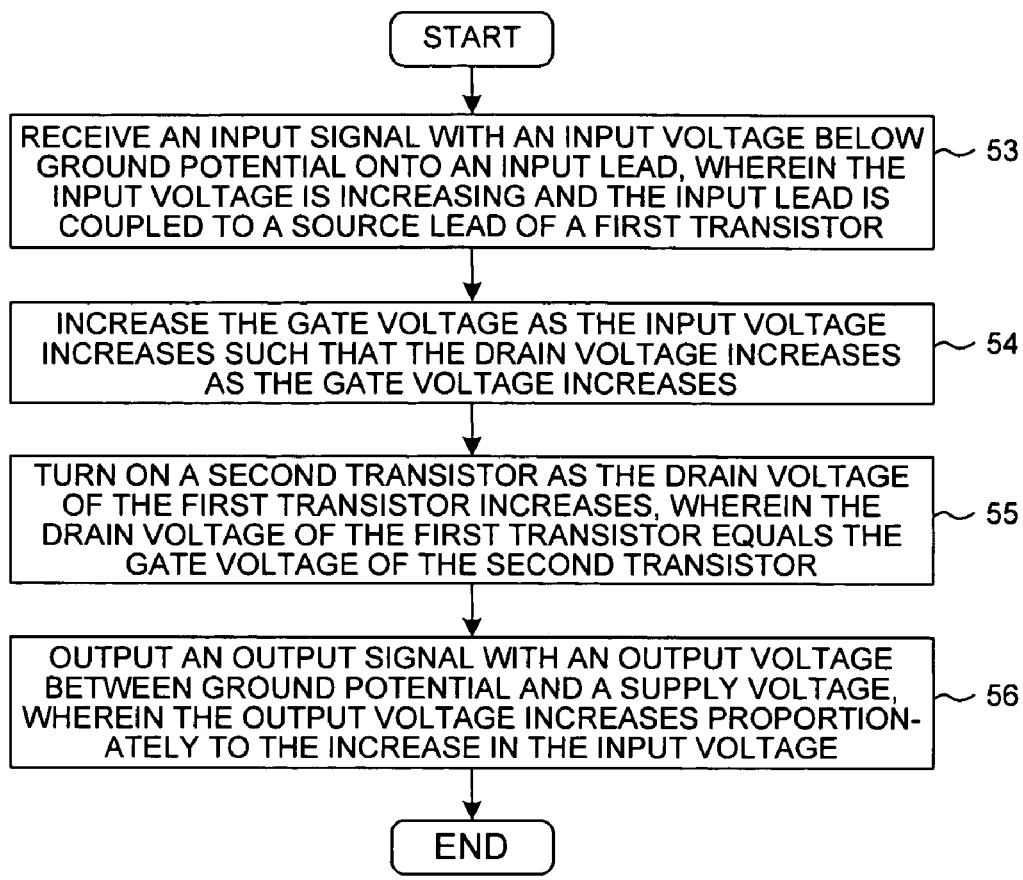
FIG. 3 is a flowchart of steps for sensing an input voltage that lies below a ground potential.

FIG. 3 is a flowchart illustrating steps 53–56 of a method by which system 10 senses an input voltage that lies below a ground potential. In addition to sensing voltages that lie below a ground potential, system 10 also senses input voltages above ground potential. The steps of FIG. 3 will now be described in relation to the operation of BGSI amplifier 21, as shown in FIG. 2.

In a step 53, system 10 receives an input signal with an input voltage below ground potential onto non-inverting input lead 26 of BGSI amplifier 21. In this example, the input voltage is increasing from minus one volts to plus one volts. In this embodiment, BGSI amplifier 21 is configured to sense input voltages between −600 millivolts and +700 millivolts.

Figure 4:
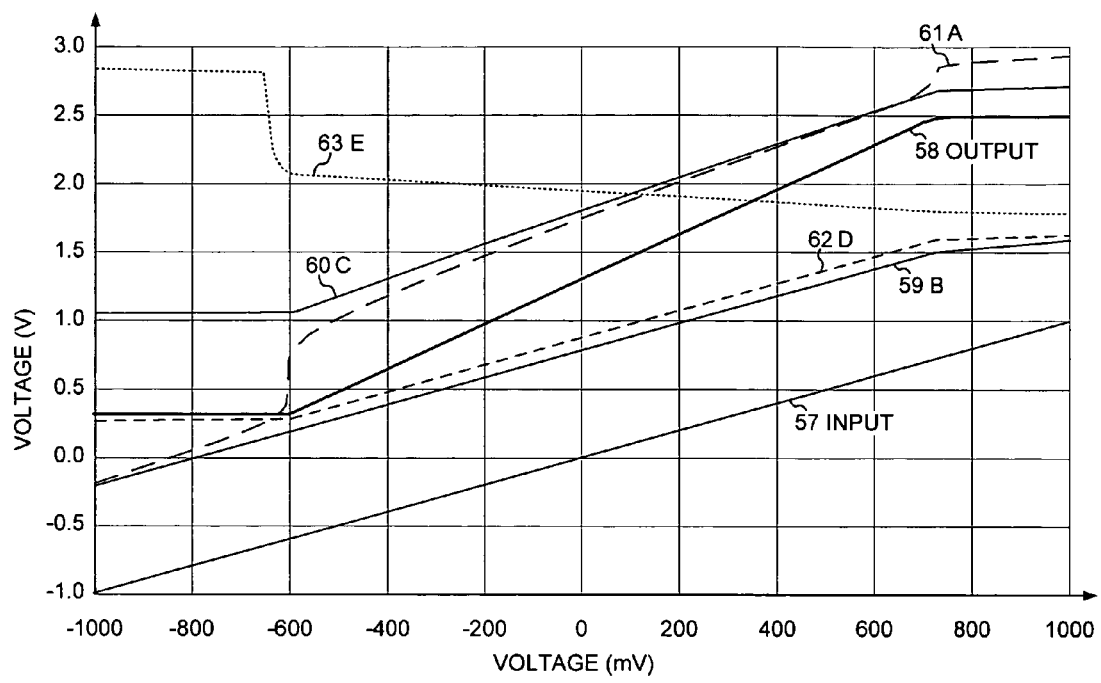
FIG. 4 is a waveform diagram of input voltage versus output voltage of the below-ground sensor interface amplifier of FIG. 1.

FIG. 4 is a waveform diagram showing the relationship between the input voltage and output voltage of BGSI amplifier 21. In addition, FIG. 4 illustrates the voltages on various nodes of BGSI amplifier 21. FIG. 4 shows an input voltage signal 57 of an input signal increasing linearly from −1 volts to +1 volts. An output voltage signal 58 of an output signal illustrates that the operating range of this embodiment is between −600 millivolts and +700 millivolts. The voltage of the output signal of BGSI amplifier 21 remains constant at 0.3 volts for input voltages from −1 volts to −0.6 volts, at which point output voltage signal 58 begins to rise. FIG. 4 also shows the voltages on various nodes of BGSI amplifier 21.

In a step 54, the voltage on the gate lead of transistor 33 increases as input voltage signal 57 increases and, in turn, the voltage on the drain lead of transistor 33 increases as the voltage on the gate lead increases. FIG. 2 shows that the source lead of n-channel transistor 33 is coupled through resistor 38 to non-inverting input lead 26 of BGSI amplifier 21. The drain lead, source lead, and gate lead of transistor 33 are labeled as nodes A, B and C, respectively. FIG. 4 illustrates that a voltage 59 on the source lead of transistor 33 (node B) increases in approximately parallel fashion with respect to input voltage signal 57. As voltage 59 (node B)

increases past −0.6 volts, a voltage 60 on the gate lead (node C) of transistor 33 increases and, in turn, a voltage 61 on the drain lead (node A) of transistor 33 increases.

In a step 55, n-channel FET 44 turns on as voltage 61 on node A of transistor 33 increases. Transistor 44 is larger than transistor 33, and consequently more current flows through transistor 44 than through transistor 33 at the same gate voltage. FIG. 2 shows that the drain lead of transistor 33 is coupled to the gate lead of transistor 44. Thus, voltage 61 is both the drain voltage of transistor 33 and the gate voltage transistor 44. Transistor 44 turns on as its gate voltage increases, which causes a voltage 62 on the source lead (node D) of transistor 44 to increase. FIG. 2 shows that the source lead of transistor 44 is coupled to the source lead of transistor 34. In this embodiment, node D is coupled through resistor 39 to ground potential. In other embodiments, input voltage signal 57 is compared to a voltage other than ground potential that is present on inverting input lead 27, which is coupled through resistor 39 to node D.

FIG. 4 illustrates that as transistor 44 turns on and voltage 62 on its source lead (node D) increases, a voltage 63 on the drain lead of transistor 44 (node E) decreases.

In a step 56, BGSI amplifier 21 outputs an output voltage signal 58. As voltage 63 on the drain lead of transistor 44 (node E) decreases, output voltage signal 58 increases within the operating range between −0.6 volts and +0.7 volts. As illustrated in FIG. 4, there is a sharp "knee" in the curve of output voltage signal 58 at the beginning of the operating range at −0.6 volts. Thus, the response of BGSI amplifier 21 is substantially linear from the beginning of its operating range. The response of other below-ground sensing amplifiers, especially those employing two differential pair of transistors, is sometimes not linear at the beginnings of their operating ranges. FIG. 4 shows that BGSI amplifier 21 receives input voltage signal 57, which increases from below ground potential to above ground potential, and that BGSI amplifier 21 outputs output voltage signal 58, which remains between ground potential and the positive supply voltage ($V_{CC}$) and which increases proportionately to the increase in input voltage signal 57.

Figure 5:
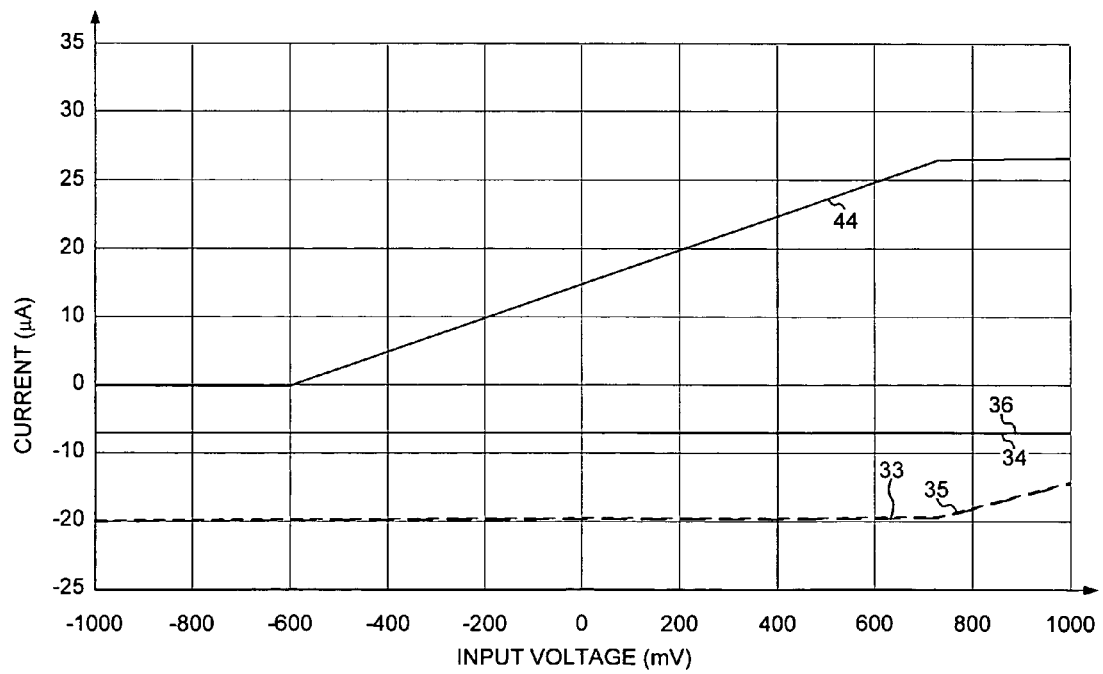
FIG. 5 is a waveform diagram of currents flowing through various transistors of the below-ground sensor interface amplifier of FIG. 1 corresponding to the input voltages graphed in FIG. 4.

FIG. 5 shows the currents flowing through various transistors of BGSI amplifier 21 as input voltage signal 57 increases from −1 volts to +1 volts. FIG. 5 shows that the currents flowing through transistors 33, 34, 35 and 36 remain relatively constant throughout the operating range of BGSI amplifier 21. In this example, about −20 microamps of current flow through transistor 35 and 33, whereas only about −7 microamps of current flow through transistors 34 and 36. FIG. 5 shows that as transistor 44 turns on in step 55, more current begins to flow through transistor 44 as input voltage signal 57 increases. No appreciable current flows through transistor 44 for input voltages below the operating range of BGSI amplifier 21.

Figure 6:
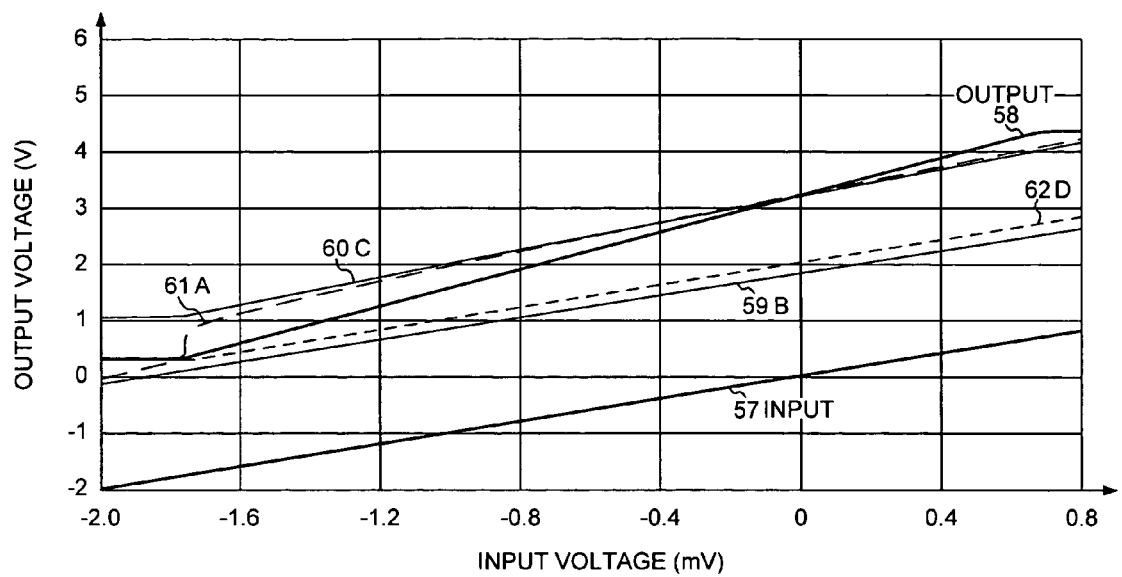
FIG. 6 is a waveform diagram of voltage waveforms on various nodes of the below-ground sensor interface amplifier of FIG. 1.

FIG. 6 is a waveform diagram showing the voltages on various nodes of BGSI amplifier 21 when input voltage signal 57 varies from −2 volts to +0.8 volts. FIG. 6 illustrates the operation of an embodiment of BGSI amplifier 21 with an operating range approximately between −1.8 volts and +0.7 volts. As with the first embodiment, output voltage signal 58 remains constant at 0.3 volts for input voltages below the operating range. FIG. 6 illustrates the operation of BGSI amplifier 21 at input voltages below ground potential by more than a threshold voltage of any transistor in BGSI amplifier 21.

Figure 7:
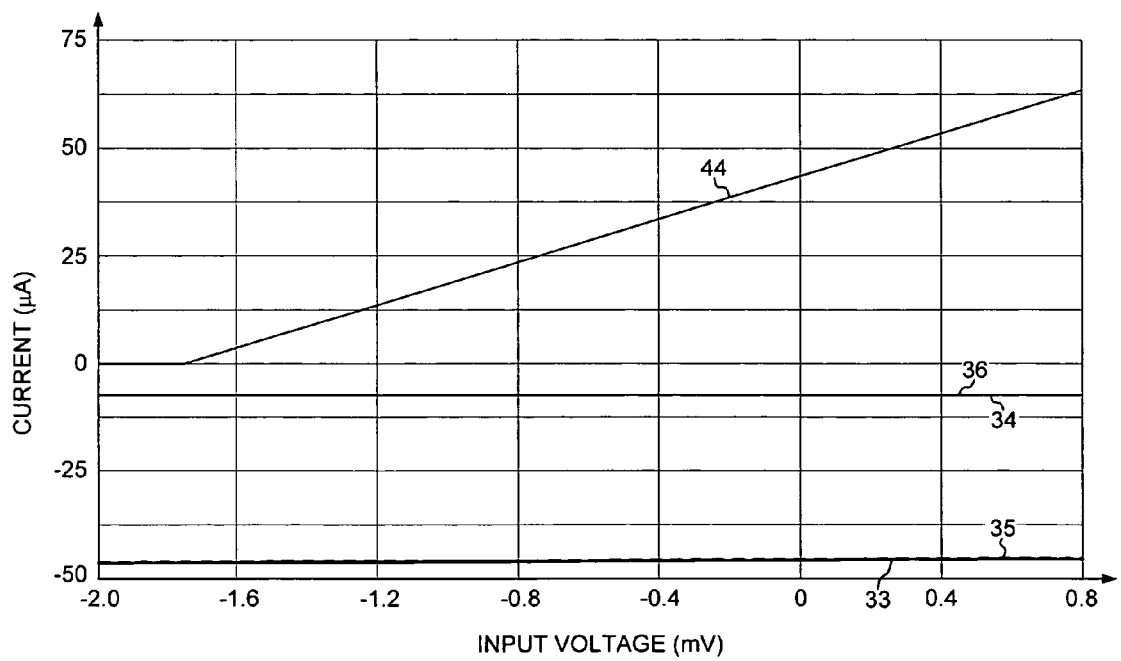
FIG. 7 is a waveform diagram of current waveforms flowing through various resistors of the below-ground sensor interface amplifier of FIG. 1.

FIG. 7 shows the currents flowing through various transistors of BGSI amplifier 21 as input voltage signal 57 increases from −2 volts to +0.8 volts. Within the operating range −1.8 volts and +0.7, the currents flowing through transistors 33, 34, 35 and 36 also remain relatively constant. In this example, about −46 microamps of current flow through transistor 35 and 33, whereas only about −8 microamps of current flows through transistors 34 and 36. FIG. 7 shows that for an operating range beginning at −1.8 volts, about 5.75 times more current is made to flow through transistor 33 than through transistor 34 of differential pair 41. For an operating range beginning at −0.6 volts, only about 2.9 times more current is made to flow through transistor 33 than through transistor 34 of differential pair 41, as shown in FIG. 5. BGSI amplifier 21 can be made to sense ever lower input voltages by increasing the size of transistor 33 relative to transistor 34, and analogously increasing the size of transistor 35 relative to transistor 36. By increasing the current mismatch of differential pair 41 and causing a larger current to flow through resistor 38 than through resistor 39, an ever lower voltage on non-inverting input lead 26 can be coupled through resistor 38 to the source of transistor 33 (node B) without causing voltage 59 on node B to fall below ground potential. FIG. 6 shows that over the entire operating range beginning at −1.8 volts, voltage 59 on node B remains above ground potential.

Figure 8:
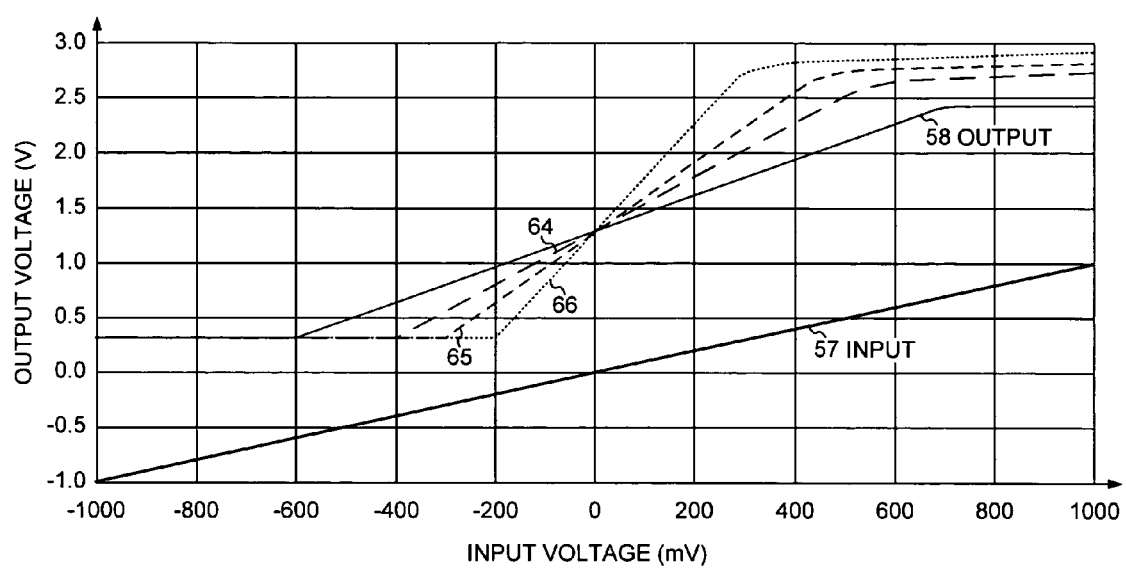
FIG. 8 is a waveform diagram of input voltage versus output voltage for four gain settings of a programmable embodiment of a below-ground sensor interface amplifier.

FIG. 8 is a waveform diagram showing the relationship between the input voltages and the output voltages for four gain settings of a programmable embodiment of BGSI amplifier 21. In this embodiment, BGSI amplifier 21 can be programmed to sense input voltages over different operating ranges. FIG. 8 shows output voltages generated by BGSI amplifier 21 when input voltage signal 57 increases linearly from −1 volts to +1 volts. Output voltage signal 58 is shown over a first operating range between −600 millivolts and +700 millivolts that corresponds to the operating range of the embodiment of FIG. 2. The embodiment represented by FIG. 8 can also be programmed to sense input voltages over three other operating ranges. An output voltage signal 64 corresponds to an operating range between −400 millivolts and +500 millivolts. An output voltage signal 65 corresponds to an operating range between −300 millivolts and +400 millivolts. And an output voltage signal 66 corresponds to an operating range between −200 millivolts and +300 millivolts.

Figure 9:
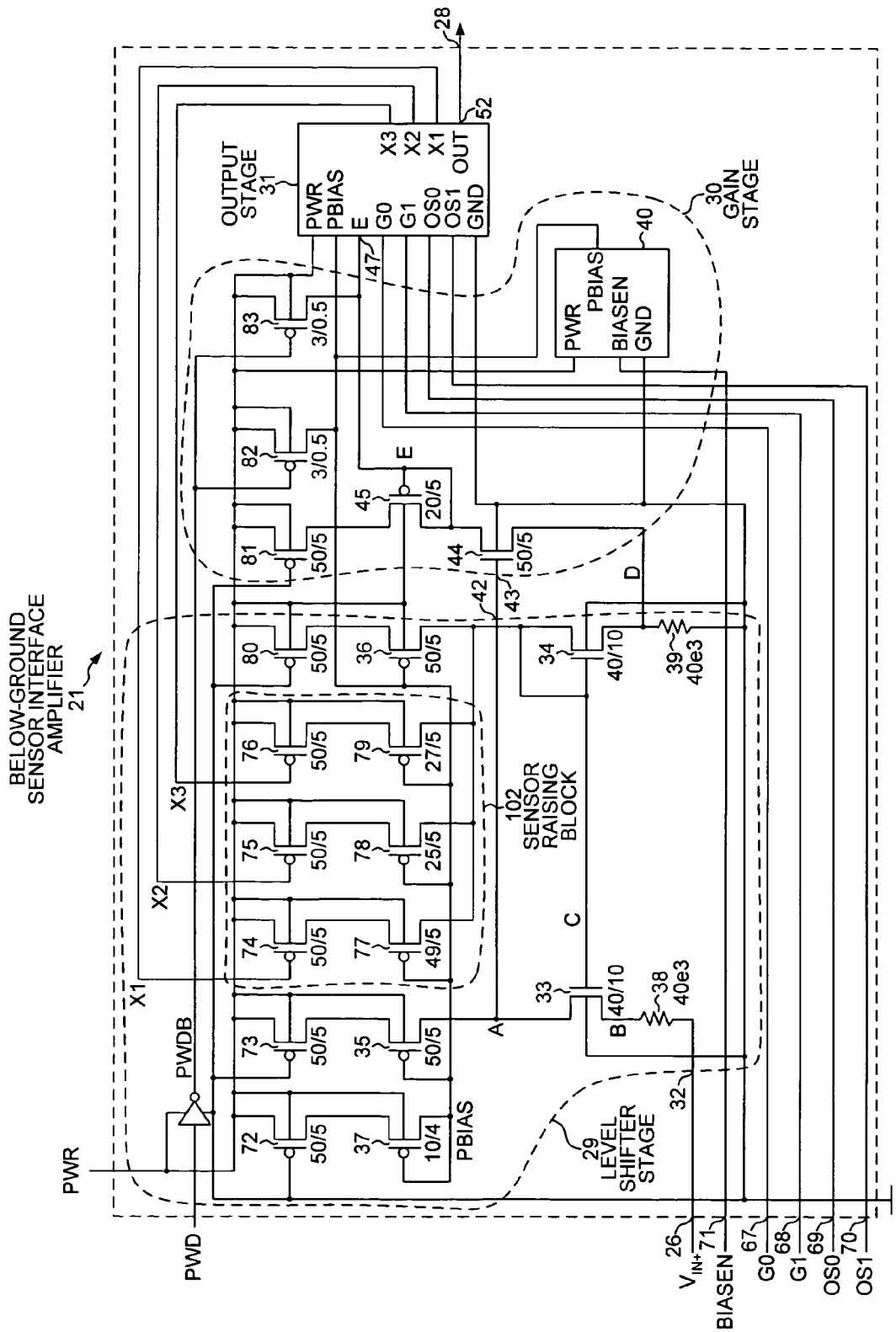
FIG. 9 is a schematic block diagram of a programmable embodiment of a below-ground sensor interface amplifier.

FIG. 9 is a schematic block diagram of a programmable embodiment of below-ground sensor interface amplifier 21 that generates the output voltages shown in FIG. 8. The embodiment of FIG. 9 includes two gain input leads 67–68 for two gain control signals G0 and G1. Two offset control signal OS0 and OS1 are received onto two offset input leads 69–70. Bias enable signal BIASEN is received onto bias input lead 71. The gain and offset of output voltage signal 58 of BGSI amplifier 21 can be programmed by asserting selected gain control signals G0 and G1, offset control signals OS0 and OS1 and bias enable signal BIASEN. Gain, offset and bias control signals are asserted by writing to gain control register 22, as shown in FIG. 1. In one example of the configuration of system 10, gain control signals G0 and G1, offset control signals OS0 and OS1 and bias enable signal BIASEN are asserted or de-asserted by writing to bits zero through four, respectively, of gain control register 22.

The embodiment of FIG. 9 includes transistors 72 through 101, in addition to the transistors of the embodiment of FIG. 2. FIG. 9 lists the width and length dimensions in microns ($10^{-6}$ meters) below each of the transistors. Transistors 35–36, 49, 72–76, 80–81, 84–87 and 91–93 are p-channel metal-oxide-semiconductor (PMOS) transistors. Transistors 44, 94–95 and 99–101 are n-channel metal-oxide-semiconductor (nMOS) transistors. Each of resistors 38, 39, 50 and 51 has a resistance of forty kilo-ohms and is realized as a transistor with a width and length dimension in microns of 5/137.85.

A sensor raising block 102 of six transistors 74–79 is programmable to increase the current flowing onto node C and thereby increase the input voltage at which transistor 44 turns on. The lower limit of the operating range of BGSI amplifier 21 begins at the input voltage at which transistor 44 turns on. In the embodiment of FIG. 9, transistors 77–79 are biased on. The first operating range between −600 millivolts and +700 millivolts, as illustrated by output voltage signal 58 of FIG. 8, is achieved by keeping transistors 74–76 turned off. An operating range between −400 millivolts and +500 millivolts, as illustrated by output voltage signal 64 of FIG. 8, is achieved by turning on transistor 74 when signal X1 is asserted active low. By asserting both signal X1 and signal X2 active low, an operating range between −300 millivolts and +400 millivolts corresponding to output voltage signal 65 of FIG. 8 is achieved. By asserting all three signals X1, X2 and X3 active low, an operating range between −200 millivolts and +300 millivolts corresponding to output voltage signal 66 of FIG. 8 is achieved.

Figure 10:
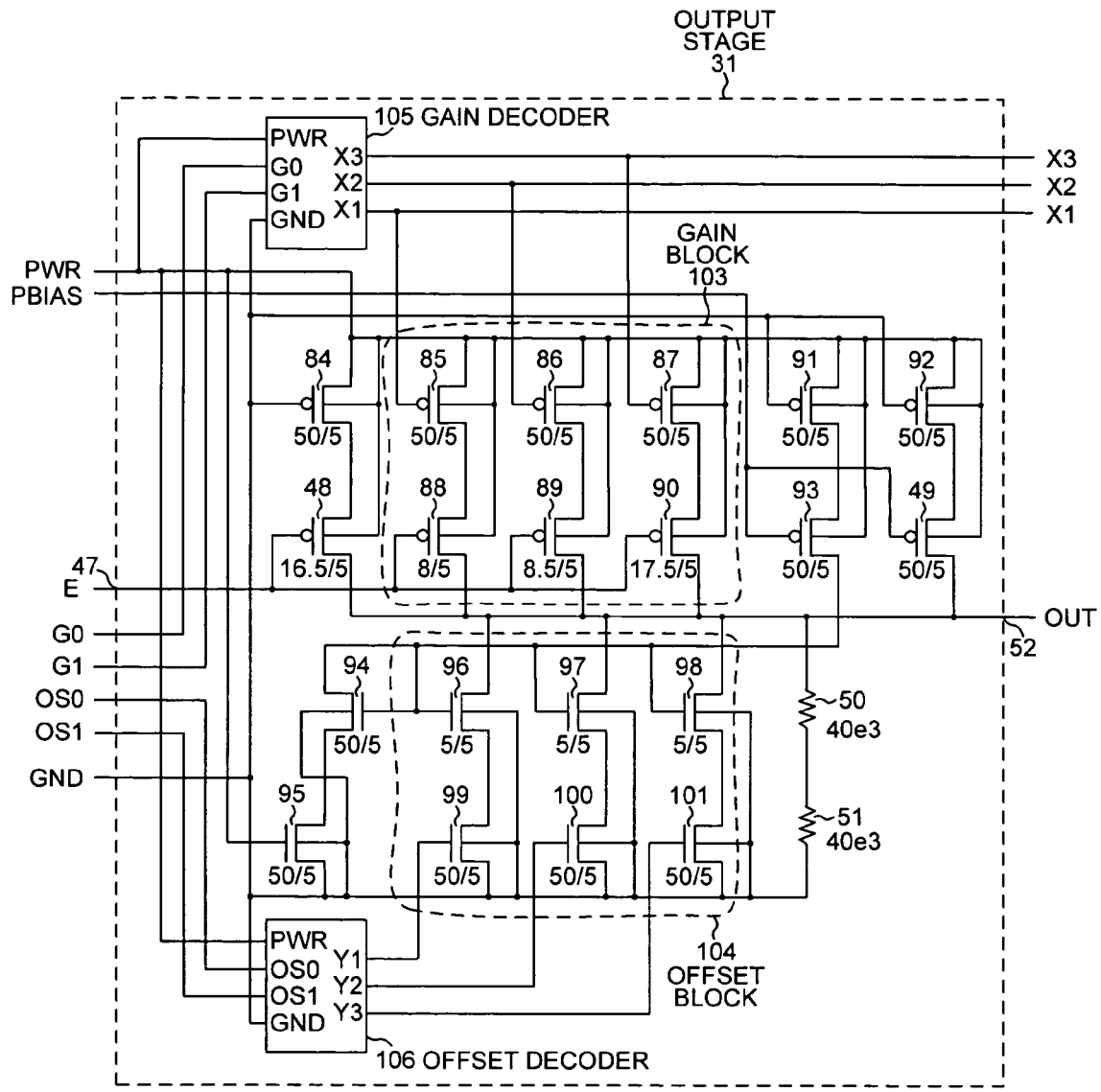
FIG. 10 is more detailed schematic diagram of an output stage of the below-ground sensor interface amplifier of FIG. 9.

FIG. 10 shows output stage 31 in more detail. In addition to resistors 50–51 and transistors 48–49 and 84–101, output stage 31 includes a gain block 103 of transistors, an offset block 104 of transistors, a gain decoder 105 and an offset decoder 106. Gain decoder 105 receives gain control signals G0 and G1 from gain control register 22 and outputs signals X1, X2 and X3. For example, when a digital zero is stored in both bits zero and one of gain control register 22, gain decoder 105 de-asserts all three signals X1, X2 and X3 with a logic high, thereby causing programming BGSI amplifier 21 to operate in the first operating range between −600 millivolts and +700 millivolts.

Programming BGSI amplifier 21 to sense a narrower range of input voltages concurrently increases the gain of BGSI amplifier 21, thereby spreading out the output voltages to cover more of the output range between ground potential and the positive supply voltage ($V_{CC}$). When the operating range of the input voltage is narrowed and the lower limit of the voltage operating range increases, the gain of BGSI amplifier 21 increases. For example, when the operating range is changed from between −600 millivolts and +700 millivolts to between −400 millivolts and +500 millivolts, by asserting signal X1 active low, transistor 85 of gain block 103 as well as transistor 74 is also turned on, adding to the current flowing through transistor 48. The added current through transistor 48 increases the voltage on output lead 52 for any given voltage on node E and increases the gain of BGSI amplifier 21. For each transistor 88–90 of gain block 103 that is turned on, the gain of BGSI amplifier 21 can be expressed as the product of a first quotient of transistor sizes times a second quotient of resistor resistances, namely:

({T48+T88+T89+T90}/T45)×({R50+R51}/R39).

The voltage offset of BGSI amplifier 21 can be programmed in a manner analogous to the programming of the gain. Offset decoder 106 receives offset control signals OS0 and OS1 from gain control register 22 and outputs signals Y1, Y2 and Y3. As transistors 99, 100 and 101 are successively opened by asserting (active high) signals Y1, Y2 and Y3, respectively, the voltage offset of all output signals 58, 64, 65 and 66 is increased. Thus, BGSI amplifier 21 can be programmed such that the output voltage signal of BGSI amplifier 21 remains between ground potential and the supply voltage even when the input voltage signal begins below ground potential and increases to a magnitude above ground potential.

Figure 11:
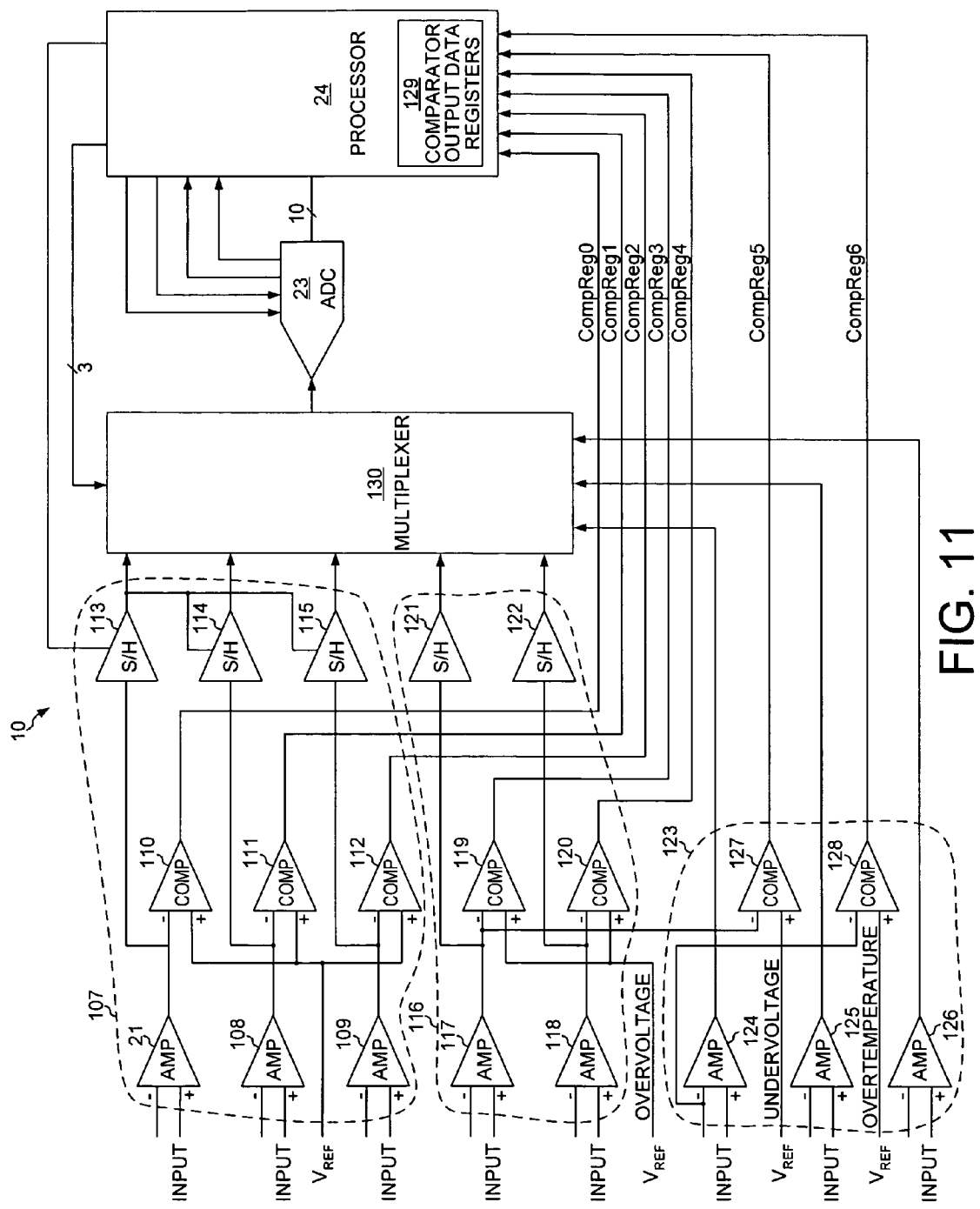
FIG. 11 is a simplified schematic block diagram of another embodiment of the system for sensing an input voltage that lies below a ground potential, including the below-ground sensor interface amplifier of FIG. 9.

FIG. 11 shows another embodiment of system 10 for sensing an input voltage, where the operating range of the input voltage extends below a ground potential. The embodiment of FIG. 11 employs the embodiment of BGSI amplifier 21 of FIG. 9 in open loop operation. System 10 is used to determine currents, voltages and temperatures of an electric motor and is included in the configuration of microcontroller 20 that performs motor control. A current determining block 107 includes three below-ground sensor interface amplifiers 21, 108 and 109, three comparators 110–112 and three sample-and-hold circuits 113–115. The embodiment of FIG. 11 is used to perform space vector control and determines the magnitude of currents flowing from three induction coils of an electric motor. System 10 determines the magnitude of the three currents by determining the voltage drop across three resistances using the three BGSI amplifiers 21, 108 and 109 to sense voltage. System 10 includes a voltage determining block 116 with amplifiers 117–118, comparators 119–120 and sample-and-hold circuits 121–122. A temperature determining block 123 includes amplifiers 124–126 and comparators 127–128.

Processor 24 includes seven comparator output data registers 129 that receive and store the outputs of comparators 110–112, 119–120 and 127–128. A multiplexer 130 receives the outputs of sample-and-hold circuits 113–115 and 121–122 of current determining block 107 and voltage determining block 116, as well as the outputs of amplifiers 124–126 of temperature determining block 123. The output of multiplexer 130 is fed into ADC 23. Processor 24 receives the digitized output of ADC 23. System 10 also contains several gain control registers in the manner set forth in FIG. 1 (not shown in FIG. 11) that control the operation of BGSI amplifiers 21, 108 and 109.

Although the present invention has been described in connection with certain specific embodiments for instructional purposes, the present invention is not limited thereto. The operation of a below-ground sensor interface amplifier is explained in connection with sensing voltages below ground in order to control an electric motor. The below-ground sensor interface amplifier, however, can be utilized in applications other than motor control. Accordingly, various modifications, adaptations, and combinations of various features of the described embodiments can be practiced without departing from the scope of the invention as set forth in the claims.

What is claimed is:

1. A device comprising:
   (a) an input lead, an input voltage being present on said input lead, said input voltage being below a ground potential;
   (b) an output lead, an output voltage being present on said output lead, said output voltage being between said ground potential and a supply voltage;
   (c) a first transistor with a drain lead, a source lead and a gate lead, wherein said input lead is coupled to said source lead; and
   (d) a second transistor with a source lead and gate lead, wherein said gate lead of said first transistor is connected to said gate lead of said second transistor, wherein said source lead of the second transistor is coupled to said ground potential, and wherein said output voltage increases proportionately to an increase in said input voltage.

2. The device of claim 1, wherein said supply voltage is above said ground potential, and wherein said device is coupled to a single supply voltage.

3. The device of claim 1, wherein said device comprises no terminal for receiving a negative supply voltage.

4. The device of claim 1, wherein said first transistor exhibits a threshold voltage, and wherein said input voltage is at times more than one threshold voltage below said ground potential.

5. The device of claim 1, further comprising:
(d) a third transistor with a gate lead that is coupled to said drain lead of said first transistor, wherein said first transistor is smaller than said third transistor.

6. The device of claim 1, further comprising:
(d) a gain stage with an input lead, wherein said input lead of said gain stage is coupled to said drain lead of said first transistor.

7. The device of claim 1, further comprising:
(d) a third transistor with a gate lead that is coupled to said drain lead of said first transistor, wherein a source voltage is present on a source lead of said third transistor, and wherein said source voltage of said third transistor increases as said input voltage increases.

8. The device of claim 7, further comprising:
(e) a fourth transistor; and
(f) a fifth transistor, wherein said gate lead of said first transistor is coupled to a drain lead of said fifth transistor, and wherein said drain lead of said first transistor is coupled to a drain lead of said fourth transistor.

9. The device of claim 7, wherein said second transistor has a source lead that is coupled to a source lead of said third transistor.

10. The device of claim 7, wherein said third transistor has a source lead that is coupled through a resistor to said ground potential.

11. The device of claim 1, further comprising:
(e) a third transistor;
(f) a fourth transistor; and
(g) a gain stage with an input lead, wherein said first transistor, said second transistor, said third transistor and said fourth transistor together comprise a level shifter stage with an output lead, wherein said output lead of said level shifter stage is coupled to said drain lead of said first transistor and to a drain lead of said third transistor, wherein said gate lead of said first transistor is coupled to a drain lead of said fourth transistor, and wherein said output lead of said level shifter stage is coupled to said input lead of said gain stage.

12. The device of claim 4, wherein said output voltage increases linearly to said increase of said input voltage when said input voltage is more than one threshold voltage below said ground potential.

13. The device of claim 1, wherein said device has fewer than ten transistors.

* * * * *